United States Patent
Yang et al.

(10) Patent No.: US 7,834,274 B2
(45) Date of Patent: Nov. 16, 2010

(54) MULTI-LAYER PRINTED CIRCUIT BOARD AND METHOD FOR FABRICATING THE SAME

(75) Inventors: Ming-Huan Yang, Taichung County (TW); Chung-Wei Wang, Sijhih (TW); Chia-Chi Wu, Sindian (TW); Chao-Kai Cheng, Hsinchu County (TW); Tzyy-Jang Tseng, Taoyuan (TW); Chang-Ming Lee, Taoyuan (TW); Cheng-Po Yu, Taoyuan (TW); Cheng-Hung Yu, Taoyuan (TW)

(73) Assignees: Industrial Technology Research Institute, Hsinchu (TW); Unimicron Technology Corp., Taoyuan (TW)

( * ) Notice: Subject to any disclaimer, the term of this patent is extended or adjusted under 35 U.S.C. 154(b) by 925 days.

(21) Appl. No.: 11/554,882

(22) Filed: Oct. 31, 2006

(65) Prior Publication Data
US 2007/0153488 A1    Jul. 5, 2007

(30) Foreign Application Priority Data
Dec. 30, 2005    (TW)    ............. 94147547 A

(51) Int. Cl.
*H05K 1/03* (2006.01)
(52) U.S. Cl. ............ 174/255; 174/261; 174/262; 361/778
(58) Field of Classification Search ........... 174/255, 174/261, 262; 361/778
See application file for complete search history.

(56) References Cited

U.S. PATENT DOCUMENTS

| | | | |
|---|---|---|---|
| 5,502,893 A | 4/1996 | Endoh et al. | |
| 6,195,883 B1 | 3/2001 | Bhatt et al. | |
| 6,370,768 B1 * | 4/2002 | Itabashi | 29/852 |
| 6,779,262 B1 | 8/2004 | Gales et al. | |
| 2002/0083586 A1 | 7/2002 | Iijima et al. | |
| 2002/0120550 A1 | 8/2002 | Yang | |

(Continued)

FOREIGN PATENT DOCUMENTS

JP    2002170936    6/2002

(Continued)

OTHER PUBLICATIONS

Yang, "Vertically Integrated Electronic Circuits via a Combination of Self-Assembled Polyelectrolytes, Ink-Jet Printing, and Electroless Metal Plating Processes", Langmuir 2002, vol. 18, pp. 8142-8147.

(Continued)

*Primary Examiner*—Tuan T Dinh
*Assistant Examiner*—Andargie M Aychillhum
(74) *Attorney, Agent, or Firm*—Alston & Bird LLP

(57) ABSTRACT

A method for fabricating a double-sided or multi-layer printed circuit board (PCB) by ink-jet printing that includes providing a substrate, forming a first self-assembly membrane (SAM) on at least one side of the substrate, forming a non-adhesive membrane on the first SAM, forming at least one microhole in the substrate, forming a second SAM on a surface of the microhole, providing catalyst particles on the at least one side of the substrate and on the surface of the microhole, and forming a catalyst circuit pattern on the substrate.

16 Claims, 4 Drawing Sheets

U.S. PATENT DOCUMENTS

| | | |
|---|---|---|
| 2003/0022403 A1 | 1/2003 | Shimoda et al. |
| 2005/0120550 A1* | 6/2005 | Cheng et al. .................. 29/825 |
| 2006/0145343 A1* | 7/2006 | Lee et al. .................... 257/737 |

FOREIGN PATENT DOCUMENTS

| | | |
|---|---|---|
| JP | 2004140081 | 5/2004 |
| JP | 2004342741 | 12/2004 |
| JP | 2005057140 | 3/2005 |
| KR | 10 2002 0095800 A | 12/2002 |

OTHER PUBLICATIONS

Lowenheim, F.A., Modern Electroplaing, $3^{rd}$ ed. Wiley, NY, 1974, pp. 165-223.
Mandich et al., Plating and Surface Finishing 80 (1993) pp. 68-73.
Deckert, Plating and Surface Finishing 82 (2) (1995) pp. 48-55.
Deckert, Plating and Surface Finishing 82 (3) (1995) pp. 58-64.
Office Action issued in corresponding Taiwanese Application.

* cited by examiner

MULTI-LAYER PRINTED CIRCUIT BOARD AND METHOD FOR FABRICATING THE SAME

DESCRIPTION OF THE INVENTION

1. Field of the Invention

The present invention relates to a printed circuit board, and more particularly, to a double-sided or multi-layer printed circuit board (PCB) and method for fabricating the same.

2. Background of the Invention

With the rapid development of electronic products having a reduced size, high-density packaging technology must meet these requirements. A printed circuit board (PCB) is a major device for carrying electronic products. Thus, the manufacturing technology tends to make PCBs lightweight, thin, and having fine lines and mini holes and other high-density designs. A conventional process for fabricating a PCB wiring board includes pressing a metal membrane onto a substrate, coating a photoresist layer via spin coating, and then carrying out the steps of masking exposure, developing, etching, drilling and baking, laminating and plating, and the like. The entire manufacturing process requires repeated testing and repairs. Therefore, the conventional process is rather complicated.

U.S. Pat. No. 6,195,883 describes a method for fabricating a multi-layer PCB, wherein a fully-additive process is utilized to fabricate a circuit board with high-density wires. A copper-clad substrate is drilled and then immersed in a Pd/Sn catalyst. After that, chemical plating or electric plating is conducted until the substrate reaches a certain thickness. Then, a photoresist material is coated to protect the through holes and the fabricated circuit pattern. An etching process is carried out to remove the photoresist.

U.S. Patent Application Publication No. 2002/0083586 describes a method for fabricating a multi-layer PCB, wherein copper foils are attached onto two sides of a resin substrate. A resin is then coated thereon, and a small hole is formed via laser drilling. The size of the most external drilled hole is bigger than that of a blind hole. The holes are made to become through holes via a subsequent chemical plating process.

U.S. Pat. No. 5,502,893 describes a method to coat through holes on a metal plate. Specifically, on a metal plate with microholes, a first metal layer is formed in the microholes through an electric plating process. A second metal layer is then formed on the first metal layer through electric plating. The second metal layer is blackened to form a layer of non-conductive organic material on the second metal layer. An interconnected circuit is finally formed on the non-conductive organic material.

A process of generating a metal line via chemical plating by printing a catalyst is first described in a patent by E.I. DuPont in 1987. A known problem in growing a metal membrane on the substrate through chemical plating is poor metal adhesiveness. The problem may be solved by increasing the roughness of the substrate through physical polishing or chemical etching. However, these etching processes may not be suitable for all types of substrates.

In 2000, Rubner described a method of growing several layers of self-assembly membranes (SAMs) on a substrate. The substrate is sprayed with a polyelectrolyte polymer solution, and then immersed in a catalyst solution. A Pd-complex is generated by a reaction between the sprayed material and the catalyst, and finally, the chemical nickel plating is carried out. In 2001, Yang Yang provided a similar method for fabricating a vertical multi-layer integrated circuit in the article entitled "Vertically Integrated Electronic Circuits via a Combination of Self-Assembled Polyelectrolytes, Ink-Jet Printing, and Electroless Metal Plating Processes" Langmuir 2002, Vol. 18, pp. 8142~8147. Display Technology Center of Printable Science Department of Industrial Technology Research Institute also discloses an improved technique in U.S. Patent Publication No. 2005/0120550, wherein a catalyst circuit is sprayed and printed onto a substrate covered by several layers of SAMs. A proton exchanging reaction occurs between the catalyst and the membrane, thereby forming a Pd-complex with a catalyst activity. A single-layer board with metal circuits is formed through chemical plating.

BRIEF SUMMARY OF THE INVENTION

An object of the present invention is to provide a method for fabricating a double-sided or multi-layer printed circuit board (PCB) through an ink-jet printing technology. The present invention provides a method for fabricating a double-sided or multi-layer PCB to reduce manufacturing cost and meet diversified requirements of the market place.

In one embodiment, there is provided a method for fabricating a double-sided or multi-layer printed circuit board (PCB) by ink-jet printing that includes providing a substrate, forming a first self-assembly membrane (SAM) on at least one side of the substrate, forming a non-adhesive membrane on the first SAM, forming at least one microhole in the substrate, forming a second SAM on a surface of the microhole, providing catalyst particles on the at least one side of the substrate and on the surface of the microhole, and forming a catalyst circuit pattern on the substrate.

In another embodiment, there is provided a method for fabricating a multi-layer printed circuit board (PCB) that includes providing a substrate, forming a self-assembly membrane (SAM) at each side of the substrate, forming a non-adhesive membrane on the SAM, forming at least one microhole in the substrate, forming the SAM on a surface of the microhole, applying catalyst particles on at least one side of the substrate and on the surface of the microhole, forming a catalyst circuit pattern on the substrate through catalyst micro-dispensing and accelerator solution immersing, and immersing the substrate into an electrolyte to form a metal circuit on the substrate and a metal membrane in the microhole.

There is also provided a double-sided printed circuit board that includes a substrate defining at least one microhole, a self-assembly membrane (SAM) formed on at least one side of the substrate, a catalyst layer formed on a surface of the microhole on the substrate, a metal membrane formed on the surface of the microhole with the catalyst layer, and a first circuit formed on the SAM.

Consistent with another embodiment, there is provided a multi-layer printed circuit board (PCB) that includes a first substrate defining at least one microhole, a first self-assembly membrane (SAM) formed at each side of the first substrate, a first catalyst layer formed on a surface of the microhole on the first substrate, a first metal membrane formed on the surface of the microhole with the first catalyst layer therebetween, a first circuit formed at one side of the first substrate with the first SAM therebetween, and a second circuit formed on another side of the first substrate with the first SAM therebetween.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the present invention and together with the description, serves to explain the principles of the invention.

BRIEF DESCRIPTION OF THE SEVERAL VIEWS OF THE DRAWINGS

Reference will now be made in detail to the present embodiments of the invention, examples of which are illustrated in the accompanying drawings. Wherever possible, the same reference numbers are used throughout the drawings to refer to the same or like parts.

DETAILED DESCRIPTION OF THE INVENTION

In this detailed description, for purposes of explanation, numerous specific details are set forth to provide a thorough understanding of embodiments of the present invention. One skilled in the art will appreciate, however, that embodiments of the present invention may be practiced without these specific details. In other instances, structures and devices are shown in block diagram form. Furthermore, one skilled in the art can readily appreciate that the specific sequences in which methods are presented and performed are illustrative and it is contemplated that the sequences can be varied and still remain within the spirit and scope of embodiments of the present invention.

Figure 1A:
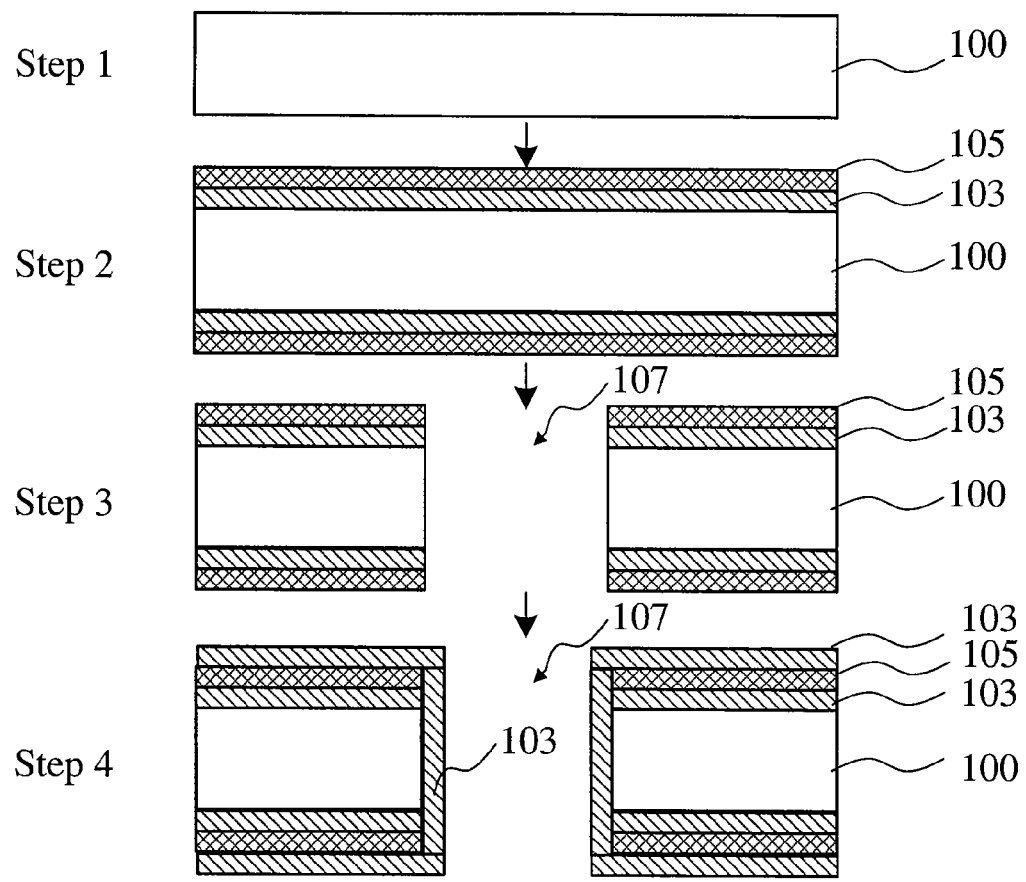
FIGS. 1A to 1B are cross-sectional views of a method for fabricating a double-sided printed circuit board (PCB) by ink-jet printing according to one embodiment of the present invention.
Figure 1B:
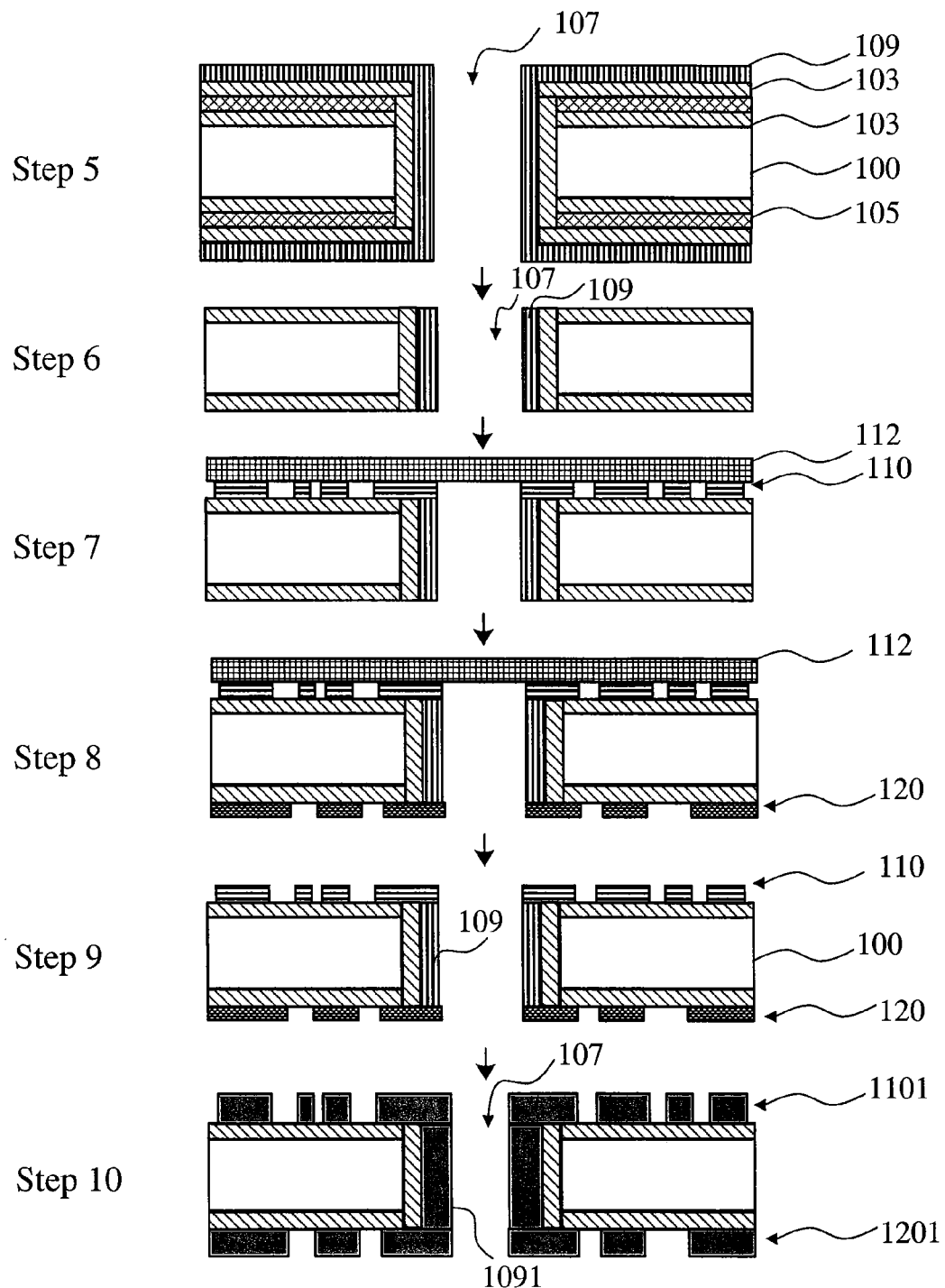

FIGS. 1A and 1B are cross-sectional views of a method for fabricating a double-sided printed circuit board (PCB) by ink-jet printing according to one embodiment of the present invention. Referring to FIG. 1A, a substrate 100 selected from a group consisting of known substrates including plastic substrates, ceramic substrates, metal plates, paper boards, glass substrates, PET substrates, FR-4 substrates, flexible FR-4 substrates, polyimide substrates, epoxy resin, or any combination thereof is provided at Step 1.

At Step 2, a surface treatment process is used to form a self-assembly membrane (SAM) 103 on at least one major surface, or side, of the substrate 100. The surface treatment process includes immersing the substrate 100 in an anionic or cationic polyelectrolyte solution. The substrate 100 is then immersed in an anionic or cationic polyelectrolyte solution having an opposite charge from the previous polyelectrolyte solution. In other words, if the substrate 100 is first immersed in an anionic polyelectrolyte solution, it is then immersed in a cationic polyelectrolyte solution, and vice versa. These two steps may be repeated as necessary as required according to the final requirements of the process. The substrate 100 is then immersed in the polyelectrolyte solution having the same charge as the first step of the surface treatment process. The anionic polyelectrolyte solution used in the surface treatment process of the present invention may be selected from a group consisting of polyacrylic acid (PAA), polymethacrylic acid (PMA), poly(styrene sulfonate) (PSS), poly(3-thiopheneacetic acid (PTAA), or any combination thereof. The cationic polyelectrolyte solution may be selected from a group consisting of polyallylamine hydrochloride (PAH), polyvinylalcohol (PVA), polyvinylimidazole ($PVI^+$), poly(vinylpyrrolidone) ($PVP^+$), polyaniline (PAN), or any combination thereof.

Referring again to FIG. 1A, the SAM 103 is a multi-layer membrane structure, and the surface property of the substrate 100 can be changed through the SAM 103. For example, the adhesiveness of the metal chemically plated material, and the lubricity and corrosion resistance of the material can be enhanced. The electrical and optical properties of the material can be promoted, or an electro-active layer suitable for various optical and electronic sensors can be formed. The self-assembly of the molecule is achieved through a special functional group (e.g., a hydrogen bond) or oppositely-charged non-ionic polymers or cationic, anionic polymers in the aqueous solution being adsorbed onto the material surface in a spontaneous layer-to-layer manner. A bi-layer structure is formed by the selectively adsorbed polymers, thereby forming a multi-layer self-assembly structure.

The multi-layer membrane of cationic polyelectrolyte polymer/anionic polyelectrolyte polymer is a preferred embodiment of the SAM, which is formed on many substrates, such as a glass substrate, a PET substrate, a BT substrate, and an FR-4 or PI substrate used in an ordinary circuit board. The method of fabricating the multi-layer membrane is described as follows. First, the substrate is immersed in a cationic polyelectrolyte polymer solution for a few minutes, and immersed in water for cleaning. The substrate is then immersed in an anionic polyelectrolyte polymer solution for a few minutes, and then cleaned with water. These steps of immersing, absorbing and cleaning are repeated until the desired number of layers are formed. The layer is formed by the cationic polyelectrolyte polymer and the anionic polyelectrolyte polymer. Finally, the multi-layer membrane is blown dry by, for example, an air gun, and then can be stored in an ordinary environment.

After the SAM 130 is formed at each side of the substrate 100, a non-adhesive membrane 105 is then capped on each SAM 103. The material of the non-adhesive membrane 105 may be selected from a group consisting of an electrostatic absorption film, a hydrophobic absorption film, an absorption film for a polymer multi-layer membrane, or any combination thereof. Referring again to FIG. 1A, at Step 3, the substrate 100 is drilled to form at least one microhole 107. Smears on the substrate can be removed during drilling as needed. At Step 4, the above-described surface treatment process is conducted on the substrate 100 again to form the SAM 103 on the surfaces of the microhole 107 and the non-adhesive membrane 105.

Referring now to FIG. 1B, the substrate 100 is immersed in a catalyst solution, and then an accelerator solution at Step 5 to form catalyst particles 109 on at least one of the sides of the substrate 100 and the surface of the microhole 107. The catalyst is, for example, a metal-salt containing catalyst. The salt in the metal-salt containing catalyst is, for example, a palladium salt catalyst or a platinum salt catalyst. The palladium salt catalyst is, for example, an aqueous $Pd(NH_3)_4Cl_2$ solution or an aqueous $Na_2PdCl_4$ solution. The accelerator solution contains dimethylamine borane (DMAB) and formaldehyde.

At Step 6, the non-adhesive membranes 105 are peeled off from the side surfaces of the substrate 100, and only the catalyst particle 109 remain on the surface of the microhole 107. At Step 7, the catalysts are sprayed onto the substrate 100 through micro-dispensing, and then the substrate 100 is immersed in an accelerator solution to form a black grey catalyst circuit pattern 110. If the two surfaces of the substrate 100 require different catalyst circuit patterns, an electrostatic absorption film 112 can be capped onto the catalyst circuit pattern 110 for protection.

At Step 8, a catalyst circuit pattern 120 is formed on the other sides of the substrate 100 with the same step. The microhole 107 may exhibit a rounded profile on the top of the structure. Then, the electrostatic absorption film 112 is peeled off in Step 9. At the same time, two sides of the substrate 100 are provided with two different catalyst circuit patterns 110 and 120, and the surface of the microhole 107 is provided with the catalyst particles 109.

At Step 10, the substrate 100 is immersed in an electrolyte to form metal circuits 1101 and 1201 on the substrate 100, and a metal membrane 1091 in the microhole 107. Therefore, a double-sided PCB is formed. The material for the metal circuits 1101 and 1201 may be selected from a group consisting of Cu, Ni, Ag, Au, or any combination thereof. In one example where the material of the metal circuit 1101 and 1201 is Cu, the electrolyte used may be a chemical copper plating solution, and its formulation is known by one of ordinary skill in the art. Further information on the formation of the chemical copper plating is available from F. A. Lowenheim, Modern Electroplating, 3rd ed., Wiley, N.Y., 1974; N. V. Mandich, G. A. Krulik, Plating and Surface Finishing 80 (1993) 68; C. A. Deckert, Plating and Surface Finishing 82 (2) (1995) 48; and Plating and Surface Finishing 82 (3) (1995) 58.

All reagents are dissolved in a deionized water, and then stirred for a few minutes. Moreover, to enhance the stability of the solution, a bubble generator may be installed in the plating tank so as to avoid generating copper particles in the plating solution by using the oxygen in the air. Thus, deactivation of the plating solution can be avoided.

In chemical plating experiments, the plating time and the temperature of the plating solution both are important factors for controlling the thickness of conductive lines. To obtain a microhole with high uniformity, stirring helps to increase the uniformity of the concentration of the plating solution, and air stirring may be provided to facilitate the stability of the plating solution.

Figure 2A:
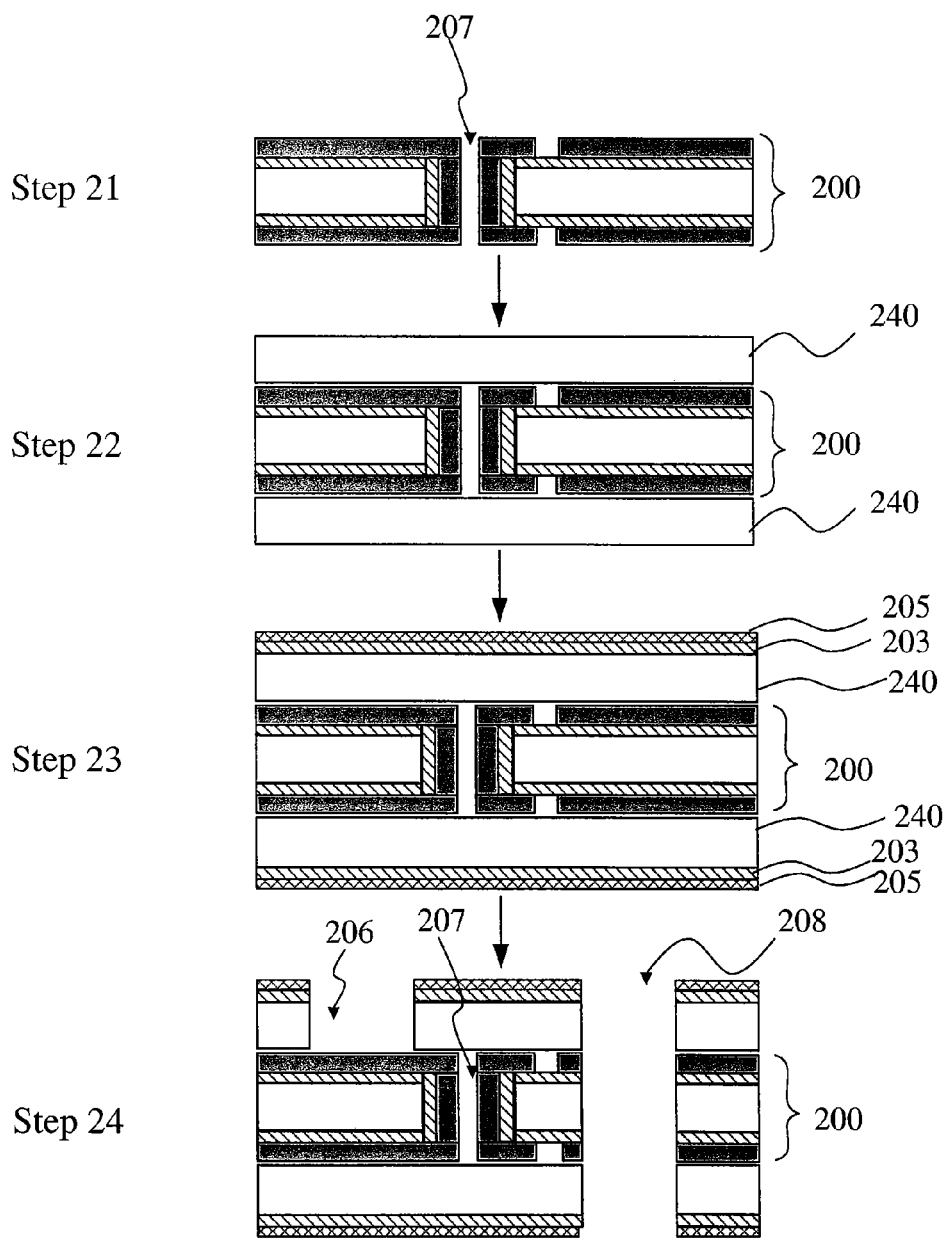
FIGS. 2A to 2B are cross-sectional views of a method for fabricating a multi-layer printed circuit board by ink-jet printing according to another embodiment of the present invention.
Figure 2B:
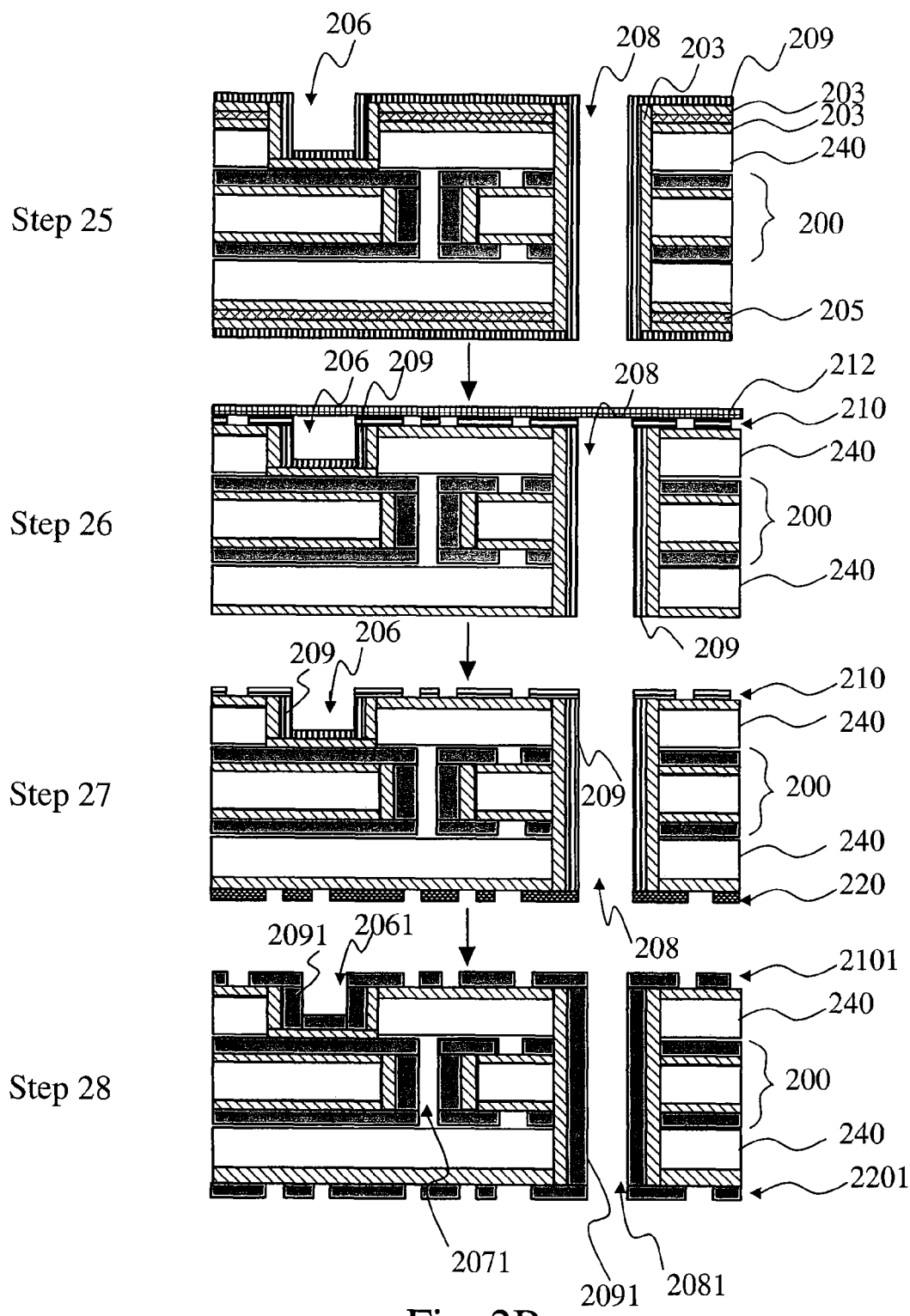

FIGS. 2A and 2B are cross-sectional views of a method for fabricating a multi-layer PCB by ink-jet printing according to another embodiment of the present invention. Referring to FIG. 2A, at Step 21, a double-sided PCB 200 is provided first. If the later-fabricated multi-layer PCB requires a buried hole, the double-sided PCB 200 that has already been drilled with a microhole 207 is provided. At Step 22, an insulating layer 240 is adhered to at least one side of the double-sided PCB 200. In one embodiment, the insulation layer 240 is provided on both major surfaces of the double-sided PCB 200. The insulating layer may be selected from a group consisting of a plastic substrate, a ceramic substrate, a metal plate, a paper board, a glass substrate, a PET substrate, an FR-4 substrate, a flexible FR-4 substrate, a polyimide substrate, an epoxy resin, or any combination thereof.

The step of forming the double-sided PCB is repeated at least once that includes Step 23, wherein a surface treatment process is conducted at first to form a SAM 203 on each insulating layer 240. A non-adhesive membrane 205 is capped onto the SAM 203. The double-sided PCB 200, together with the insulating layer 240, is drilled at Step 24, to form microholes 206 and 208.

Referring again to FIG. 2B, a surface treatment process is conducted at Step 25 to the double-sided PCB 200, together with the insulating layers 240, to form a SAM 203 on the surfaces of the microholes 206 and 208. The double-sided PCB 200, together with the insulating layers 240, is immersed in a catalyst solution, followed by an accelerator solution, to generate catalyst particles 209. At Step 26, the non-adhesive membranes 205 are peeled off, and only the catalyst particles 209 remain on the surfaces of the microholes 206 and 208. The catalyst is sprayed onto the insulating layers 240 through micro-dispensing, and the double-sided PCB 200, together with the insulating layers 240, is immersed in an accelerator solution to form a black grey catalyst circuit pattern 210. If the insulating layers 240 on two sides of the double-sided PCB 200 require different catalyst circuit patterns, an electrostatic absorption film 212 can be capped on the catalyst circuit pattern 210 for protection.

At Step 27, a catalyst circuit pattern 220 is formed on the insulating layer 240 on the other side of the double-sided PCB 200 through the same steps, and then the electrostatic absorption film 212 is peeled off. The insulating layers 240 on two sides of the double-sided PCB 200 are provided with different catalyst circuit patterns 210 and 220, and the surfaces of the microholes 206 and 208 are provided with catalyst particles 209.

At Step 28, the double-sided PCB 200, together with the insulating layers 240, is immersed in the electrolyte to form metal circuits 2101 and 2201 on the insulating layers 240 on two sides of the double-sided PCB 200, and metal membranes 2091 in the microholes 206 and 208. Therefore, a multi-layer PCB with a blind hole 2061, a buried hole 2071, and a through hole 2081 are formed. The microhole being a buried hole, a blind hole, or a through hole of the multi-layer PCB is determined through drilling.

The method for fabricating a double-sided or multi-layer PCB by ink-jet printing of the present invention does not require the conventional steps of exposing and developing a photoresist, etching, or plating, or expensive equipment and devices needed for conventional processes. Therefore, the device cost and manufacturing time period of the PCB manufacturing process can be significantly reduced. In addition, the drilling step of the present invention can be used to determine, as desired, whether the microhole becomes a buried hole, a blind hole, or a through hole of the multi-layer PCB. The consumption of expensive catalysts, the masking process, and the generation of photoresist etching waste, etc. can be reduced through the present invention, such that it satisfies environmental protection requirements, besides being cost effective.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A multi-layer printed circuit board (PCB), comprising:
a first substrate having at least one microhole;
a first self-assembly membrane (SAM) formed at each side of the first substrate;
a first catalyst layer formed on a surface of the microhole on the first substrate;
a first metal membrane formed on the surface of the microhole with the first catalyst layer therebetween;
a first circuit formed at one side of the first substrate with the first SAM therebetween; and
a second circuit formed on another side of the first substrate with the first SAM therebetween.

2. The multi-layer printed circuit board (PCB) as claimed in claim 1, wherein the microhole is a buried hole.

3. The multi-layer printed circuit board (PCB) as claimed in claim 1, wherein the microhole is a blind hole.

4. The multi-layer printed circuit board (PCB) as claimed in claim 1, wherein the microhole is a through hole.

5. A multi-layer printed circuit board (PCB), comprising:
a first substrate having at least one microhole;
a first self-assembly membrane (SAM) formed at each side of the first substrate;
a first catalyst layer formed on a surface of the microhole on the first substrate;
a first metal membrane formed on the surface of the microhole on the first substrate with the first catalyst layer therebetween;
a first circuit formed at one side of the first substrate with the first SAM therebetween;
a second circuit formed on another side of the first substrate with the first SAM therebetween;
a second substrate adhered on one side of the first substrate, the second substrate having at least one microhole;
a second SAM formed on one side of the second substrate;
a second catalyst layer formed on a surface of the microhole on the second substrate; and
a second metal membrane formed on the surface of the microhole on the second substrate.

6. The multi-layer printed circuit board (PCB) as claimed in claim 5, further comprising a third circuit formed at the side of the second substrate with the second SAM therebetween.

7. The multi-layer printed circuit board (PCB) as claimed in claim 5, wherein each of the first and the second SAM further comprises layers formed with anionic and cationic polyelectrolyte solutions.

8. The multi-layer printed circuit board (PCB) as claimed in claim 5, wherein the SAM further comprises layers formed by anionic and cationic polyelectrolyte solutions.

9. The multi-layer printed circuit board (PCB) as claimed in claim 5, wherein the catalyst comprises a metal-salt containing catalyst.

10. The multi-layer printed circuit board (PCB) as claimed in claim 5, further comprising an electrostatic absorption film on the first circuit.

11. The multi-layer printed circuit board (PCB) as claimed in claim 5, wherein the first circuit comprises a catalyst circuit.

12. The multi-layer printed circuit board (PCB) as claimed in claim 5, wherein the microhole on either or both of the first substrate or second substrate is a buried hole.

13. The multi-layer printed circuit board (PCB) as claimed in claim 5, wherein the microhole on either or both of the first substrate or second substrate is a blind hole.

14. The multi-layer printed circuit board (PCB) as claimed in claim 5, wherein the microhole on either or both of the first substrate or second substrate is a through hole.

15. The multi-layer printed circuit board (PCB) as claimed in claim 8, wherein the anionic polyelectrolyte solution is selected from group consisting of polyacrylic acid (PAA), polymethacrylic acid (PMA), poly(styrene sulfonate) (PSS), poly(3-thiopheneacetic acid) (PTAA), or any combination thereof.

16. The multi-layer printed circuit board (PCB) as claimed in claim 8, wherein the cationic polyelectrolyte solution is selected from a group consisting of polyallylamine hydrochloride (PAH), polyvinylalcohol (PVA), polyvinylimidazole ($PVI^+$), poly(vinylpyrrolidone) ($PVP^+$), polyaniline (PAN), or any combination thereof.

* * * * *